(12) United States Patent
Inoue et al.

(10) Patent No.: US 6,373,425 B1
(45) Date of Patent: Apr. 16, 2002

(54) COMPOSITE ELECTROMAGNETIC WAVE ABSORBER AND METHOD OF FITTING THE SAME

(75) Inventors: Shigeo Inoue; Toshikatsu Hayashi; Kazuo Shimada, all of Kumagaya (JP)

(73) Assignee: Kabushiki Kaisha Riken, Tokyo (JP)

( * ) Notice: Subject to any disclaimer, the term of this patent is extended or adjusted under 35 U.S.C. 154(b) by 0 days.

(21) Appl. No.: 09/418,010

(22) Filed: Oct. 14, 1999

(30) Foreign Application Priority Data

Oct. 15, 1998 (JP) .......................... 10-293670
Apr. 7, 1999 (JP) .......................... 11-099836

(51) Int. Cl.$^7$ .......................................... H01Q 17/00
(52) U.S. Cl. ................................. 342/1; 342/4
(58) Field of Search ........................... 342/1, 2, 3, 4

(56) References Cited

U.S. PATENT DOCUMENTS

| | | | |
|---|---|---|---|
| 4,786,430 A | * 11/1988 | Mair ...................... 252/62.58 |
| 4,912,143 A | * 3/1990 | Ahn et al. ................... 523/137 |
| 4,929,574 A | * 5/1990 | Iltis et al. ................... 501/137 |
| 5,198,138 A | * 3/1993 | Yamamoto et al. ........ 252/62.5 |
| 5,455,116 A | * 10/1995 | Nagano et al. ............. 428/545 |
| 5,455,117 A | * 10/1995 | Nagano et al. ............. 428/545 |
| 5,872,534 A | * 2/1999 | Mayer ........................... 342/1 |
| 5,892,188 A | 4/1999 | Hayashi et al. ............. 181/295 |
| 5,976,666 A | * 11/1999 | Narang et al. .............. 428/138 |
| 6,061,011 A | * 5/2000 | Yamamoto et al. ............ 342/1 |
| 6,146,691 A | * 11/2000 | Diaz et al. ................... 427/131 |
| 6,180,022 B1 | * 1/2001 | Kobayashi et al. ...... 252/62.62 |

* cited by examiner

Primary Examiner—John B. Sotomayor
(74) Attorney, Agent, or Firm—Kubovcik & Kubovcik

(57) ABSTRACT

A composite electromagnetic wave absorber capable of restricting the height of a pyramidal electromagnetic wave absorber and being applied to a compact anechoic chamber, wherein an upper absorber (3) is fabricated by dispersing ferrite powder in a general-purpose resin having a permittivity of not higher than 4.9.

9 Claims, 11 Drawing Sheets

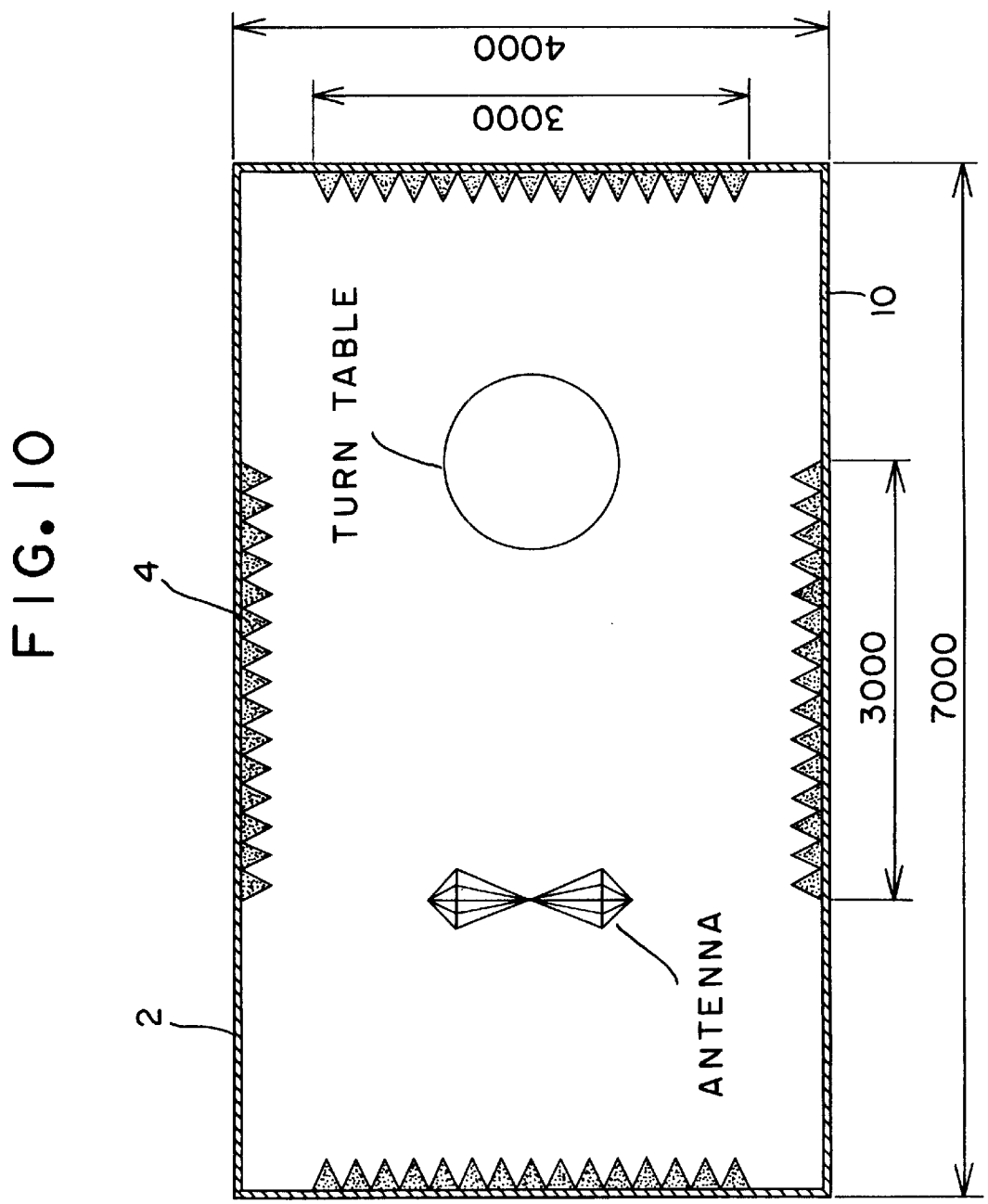

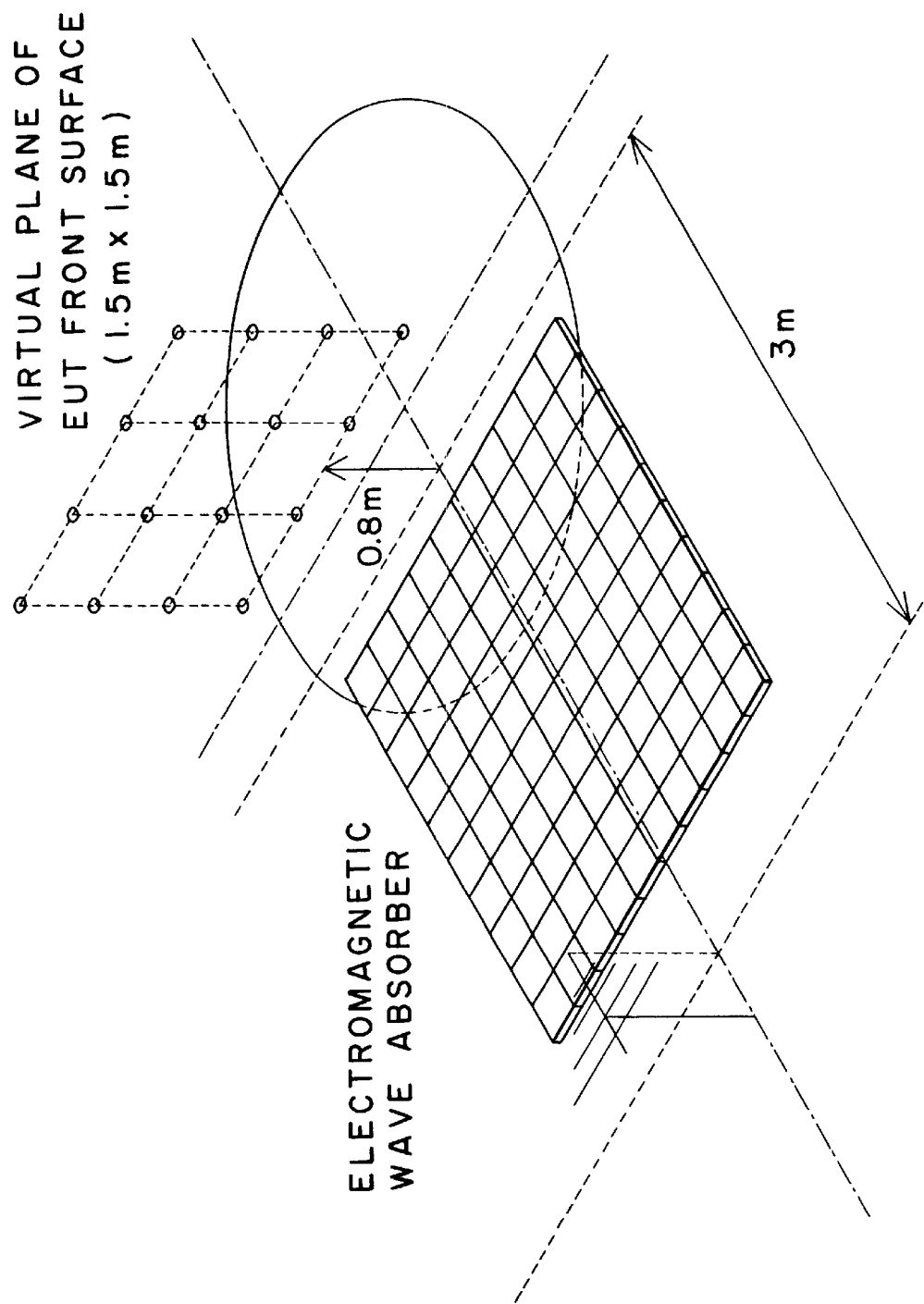

COMPOSITE ELECTROMAGNETIC WAVE ABSORBER AND METHOD OF FITTING THE SAME

BACKGROUND OF THE INVENTION

This invention relates generally to an electromagnetic wave absorber and more particularly, to a composite electromagnetic wave absorber for use in a compact anechoic chamber where there is to be no reflection of electromagnetic waves. More specifically, this invention relates to a composite electromagnetic wave absorber comprising ferrite powder dispersed non-polar resin, of pyramidal shape and a ferrite tile.

The present invention relates further to an anechoic chamber using said composite absorber and a method of fitting the same in the compact anechoic chamber.

Troubles of electromagnetic wave jamming that an electronic product imparts to other electronic products or troubles of electromagnetic wave jamming of the electronic product imparted by other electronic products, on the contrary, have been increasing in recent years. Under such circumstances, manufacturers of the electronic products have been urged to insure that their products are free from troubles of jamming even when electromagnetic wave jamming is inputted to their products and that their products do not in turn generate and emit electromagnetic wave jamming that might exert adverse influences on the products of other manufacturers. In other words, electromagnetic compatibility (EMC) for satisfying these two requirements has become necessary for electronic products in general.

A measurement chamber for evaluating these two requirements is therefore necessary. To remove the influences from any other than the electronic product that is to be measured, the outer wall of the measurement chamber is covered with a metallic plate for shielding electromagnetic waves, and its inner wall is covered with an electromagnetic wave absorber (hereinafter called merely the "absorber") lest the electromagnetic waves emitted from the electronic product are reflected by the wall. Such a measurement chamber is generally referred to an "anechoic chamber".

The anechoic chamber includes two types: the first is a large anechoic chamber for conducting EMC examination of large products (such as automobiles, large electronic appliances, and so forth) and the other is a compact anechoic chamber for examining relatively small electronic products.

The frequency range measured inside the anechoic chamber has been from 30 MHz to 1 GHz in the past. For, the frequency at which the problem of radiation of electromagnetic waves occurring is from around 30 MHz and electronic products using a frequency exceeding 1 GHz have not existed in practice.

The EMC evaluation measurement conducted inside the anechoic chamber includes a measurement of electromagnetic emission (30 MHz to 1 GHz) from the electronic product, and a radiation electromagnetic field immunity measurement (26 MHz to 1 GHz) of the electronic product to external jamming waves. In these evaluation measurements, the upper limit frequency is standardized to 1 GHz, and the conventional anechoic chambers have been designed to correspond to this standard.

Recently, however, electronic appliances that Tim use a frequency higher than 1 GHz have appeared on the market with diversification of electronic products. They are, for example, cellular telephones (1.45 GHz), microwave ranges (2.45 GHz), satellite broadcasting (4 GHz, 6 GHz), and so forth. Therefore, the standard of the measurement method in the anechoic chamber has to be changed unavoidably from the conventional standard to the one including higher frequency band than 1 GHz. The absorbers used in the anechoic chamber, too, have to be changed from those for frequency band up to 1 GHz of the prior art to those for higher frequency band than 1 GHz.

The absorbers used for the large anechoic chamber have been generally composite absorbers formed by superposing the ferrite tile and the carbon pyramid. Though only the carbon pyramid was used at first for the absorber, its absorption performance in a low frequency range of 200 GHz or below was not sufficient. Therefore, a predetermined absorption performance (generally 20 dB) had to be secured by using the ferrite tile in addition to the carbon pyramid in the composite configuration. This ferrite tile/carbon pyramid composite absorber is free from deterioration of absorption characteristics of the carbon pyramid itself for higher frequency band than 1GHz and renders no particular problem for the increase of the measurement frequency in the large anechoic chamber.

More concretely, the typical electromagnetic wave absorber used in the anechoic chamber includes a ferrite tile absorber of a sintered body of ferrite and a carbon pyramid absorber formed by shaping a carbon-impregnated resin foam into a pyramidal shape. The ferrite tile absorber exhibits excellent absorption performance in a low frequency range of a long wavelength with its thickness of only about 5 to 7 mm, but its adaptive frequency band is narrow.

Though the carbon pyramid absorber has broader frequency band absorption characteristics owing to its pyramidal configuration, the height of the pyramid must be increased in accordance with the wavelength, and results in a large construction for the low frequency band. These absorbers of different sizes are used either as a single body or in combination in accordance with the specification of the anechoic chamber and its size. They are so designed as to reduce their size as much as possible, and exhibit generally a reflection damping performance of at least 20 dB.

On the other hand, the carbon pyramid used in the large anechoic chamber is not used in the compact anechoic chamber. For, the carbon pyramid has a height of 180 cm or more, and an effective measurement space can hardly be secured in the compact anechoic chamber from the size limitation of the chamber itself. For this reason, the conventional compact anechoic chamber has been produced by bonding only the ferrite tile as the absorber, or by putting a short carbon pyramid on the ferrite tile. The compact anechoic chamber to which the ferrite tiles are merely bonded without carbon pyramids exhibits absorption characteristics that corresponds exactly to absorption characteristics provided by the ferrite tile itself, and its absorption performance sometimes fails to satisfy the absorption requirement of 20 dB in the frequency band of 30 to 60 MH and higher than 500 MHz. Quite naturally, this kind of compact anechoic chamber cannot be used in practice in the high frequency band of 1 GHz or above.

The compact anechoic chamber that uses the composite structure of ferrite tile and the short carbon pyramid (about 15 to 40 cm high) exhibits absorption performance of at least 20 dB at the frequency of 1 GHz or more, but reflection of the electromagnetic waves occurs in a frequency band of a few hundreds MHz. In this case, absorption characteristics of the ferrite tile itself are deteriorated.

In other words, the excellent absorption characteristics of the ferrite tile absorber are impeded. When the balance with absorption performance in a low frequency band of a few hundreds MHz is taken into consideration, the size of the pyramid must be increased eventually, and the height of the pyramid increases as much as 45 cm to 1 m. If this carbon pyramid absorber is added to the existing anechoic chamber comprising the ferrite tile absorber alone, the effective space of the chamber decreases and this decrease naturally impedes the measurement in the anechoic chamber. When the size of the chamber is enlarged to cope with the carbon pyramid absorber, the cost increases as much. Therefore, these measures are not practically advantageous.

To solve these problems of the absorbers of the compact anechoic chamber, the inventors of the present invention had proposed a porous ferrite absorber, that exhibits absorption performance of at least 20 dB in a high frequency band of 1 GHz or more without deteriorating absorption characteristics of the ferrite tile, in Japanese Patent Laid-Open Publication Nos. 302991/1995 and 130388/1996. The present inventors also proposed a porous ferrite/ferrite tile composite absorber produced by dispersing ferrite powder n a resin, in Japanese Patent Application No. 183640/1998. These absorbers make it possible to reduce the size of the pyramid by establishing material-wise matching with spatial impedance in a low frequency band, and exhibit excellent absorption performance in a high frequency band, too.

Nonetheless, these absorbers are not yet free from the problem of the high cost of production because expensive materials are required for achieving and controlling the pore structure, and because a complicated process is necessary. Another problem is that, depending on the kind of the resin used, moisture adsorption of the resin itself invites deterioration of quality (deterioration of absorption characteristics). Furthermore, the absorber for the anechoic chamber is fitted as the interior material and is preferably made of non-flammable material. The porous material is structurally disadvantageous from the aspect of moisture adsorption and non-flammability.

SUMMARY OF THE INVENTION

In order to solve the problem of the high production cost resulting from the porous construction and complication of the production process and to cope structurally with the problem of moisture adsorption and non-flammability that are encountered in the prior art technologies described above, it is an object of the present invention to provide a ferrite powder dispersion type absorber which can be produced easily by a simple production method without using a porous construction. In other words, the present invention provides an absorber having absorption characteristics equivalent to those of the porous ferrite/ferrite tile composite absorber which had filed by the present applicant, by shaping the absorber from a mere blend of ferrite in a general-purpose resin and superposing the absorber on the ferrite tile.

To solve the problem of the decrease of the effective space in the measurement of the high frequency band and the problem of the increase of the production cost resulting from the enlargement of the anechoic chamber, it is another object of the present invention to provide a compact anechoic chamber capable of measuring the high frequency band in the chamber size equivalent to that of the conventional ferrite chamber when the existing ferrite anechoic chamber is modified or when a new anechoic chamber is built.

Next, the fundamental concept of the present invention for solving the problems described above will be explained. As the present applicant proposed previously in Japanese Patent Application No. 183640/1998, the absorber that is put on the ferrite tile and does not deteriorate absorption characteristics of the ferrite tile (hereinafter is referred to as the "upper absorber"), must satisfy the following conditions within the frequency range of 60 MHz to 500 MHz in which absorption characteristics of the ferrite tile are high:

$$\mu r' = \epsilon r' \quad (1)$$

$$\mu r'' = \epsilon r'' \quad (2)$$

Here, $\mu r'$ and $\epsilon r'$ represent the real part of the complex permeability and the complex permittivity of the upper absorber, respectively, and $\mu r''$ and $\epsilon r''$ represent the imaginary part of the complex permeability and the complex permittivity of the upper absorber, respectively.

When the conditions (1) and (2) are satisfied, the characteristic impedance of the upper absorber matches with the spatial impedance, and is transparent wave-wise. In other words, since the electromagnetic wave merely transmits through the upper absorber, the upper absorber exerts no influence on the ferrite tile at all. Therefore, it can be said that the upper absorber does not impede absorption characteristics of the ferrite tile.

The upper absorber must exhibit at the same time higher absorption performance within the frequency range of 500 MHz or above (particularly, 1 GHz or above) in which absorption characteristics of the ferrite tile get deteriorated. To provide an upper absorber that simultaneously satisfies the transmission performance on the low frequency side and the absorption performance on the high frequency side, the present applicant has employed the concept of the porous ferrite absorber in Japanese Patent Laid-Open Publication Nos. 302991/1995 and 130388/1996 and in Japanese Patent Application No. 183640/1998. The greatest object of utilizing the porous construction is to utilize the fact that $\mu r'$ and $\epsilon r'$ of air are both 1.

By the existence of the pore and by the optimization of its amount, it has become possible to approximately satisfy the conditions (1) and (2) on the low frequency side and to shift the resonance frequency towards a higher frequency, on the high frequency side. Furthermore, a greater number of resonance are allowed to appear on the high frequency side by employing the pyramidal shape and by optimizing the height of the pyramid. As a result, an upper absorber that does not impede the absorption characteristics of the ferrite tile on the low frequency side and has absorption performance in a broader range on the high frequency side can be developed.

However, the object of the present invention is to provide the non-porous upper absorber formed by merely dispersing ferrite powder in a resin. In order that the absorber does not include pores and can be produced inexpensively, a thermosetting or thermoplastic general-purpose resin can be most suitably used for the matrix. In this case, the cost of the material is low and an economical molding method such as press molding, injection molding, extrusion molding, or the like, can be employed.

When the general-purpose resin is used, the conditions (1) and (2) must be satisfied on the low frequency side so that the resulting upper absorber has absorption characteristics equivalent to those of the ferrite absorber. As to $\mu r$, the upper absorber of the present invention formed by dispersing ferrite powder in the resin is equivalent to the porous ferrite absorber. For, both the air phase and the resin phase are non-magnetic, and they have no distinction so far as $\mu r$ is concerned.

The problem here is whether or not the value $\epsilon r$ can be the same in the porous ferrite absorber and in the upper absorber according to the present invention. In the porous ferrite absorber of the sintered type that are disclosed in Japanese Patent Laid-Open Publication Nos. 302991/1995 and 130388/1996, ferrite powder is covered around its periphery with inorganic ceramics such as alumina, silica, mullite, or the like, and is insulated. The ϵr value of these ceramics can be about 10, and the ϵr value of the matrix is determined by the mixing ratio of these ceramics and the air phase.

In Japanese Patent Application No. 183640/1998, too, the ϵr value of the matrix is determined by the mixing ratio of the phenol resin (ϵr=4 to 5) and the air phase. In either of these examples, the air phase (ϵr=1) is inserted so as to lower ϵr as the matrix. If ϵr of the component other than the air phase is low, it is possible to obtain a resin matrix that provides the same ϵr value as that of the porous ferrite and does not contain the air phase.

On the basis of such a concept, the present invention uses a non-polar resin having a particularly small ϵr value, such as polypropylene (ϵr=2.1), polyethylene, tetrafluoroethylene, and the like, for the matrix. As will be explained later, the upper absorber satisfying the conditions (1) and (2) can be produced by using the general-purpose resin such as polypropylene or polyethylene, and such an upper absorber does not impede absorption characteristics of the ferrite tile in the low frequency range.

When these non-polar resins are used, the structure may be porous. For, when the non-polar resin is used in the electromagnetic wave absorber of the present invention, matching of $\mu r$ and ϵr on the low frequency side becomes easy, and the porous structure may be used so long as the same absorption characteristics can be obtained. To achieve the porous structure, however, the raw materials for forming and controlling the pores (foaming agent, surface active agent, etc.) and a process management are necessary. It is extremely advantageous from the aspect of the cost of production if they can be eliminated.

Next, the question is whether or not absorption performance on the high frequency side is equivalent to that of the porous ferrite absorber. Absorption on the high frequency side primarily results from $\mu r"$ in ferrite powder. Therefore, non-magnetic substances are expected to exhibit the same absorption performance in all of the cases where the matrix comprises the air phase alone, the mixture of the air phase and the ceramics, the mixture of the air phase and the resin, and the resin alone. In the present invention, too, absorption performance on the high frequency side is substantially equivalent to that of the porous ferrite absorber as will be demonstrated later in Example.

It is one of the important features that the electromagnetic wave absorber does not adsorb moisture. When it does, the water molecules are entrapped into the material. Water contains the polar molecules and increases the ϵr value of the material. The electromagnetic wave absorber is so designed as to control $\mu r$ and ϵr of the material and to acquire excellent absorption characteristics.

However, the water molecules change the ϵr value and reflection by the material itself becomes great, so that absorption performance becomes lower than that designed at first. Because the anechoic chamber is used for a long period of time, it is very important from the aspect of quality that the absorber does not adsorb moisture. The non-polar resins typified by polypropylene hardly adsorb moisture and ideally, the electromagnetic wave absorber comprises such resins.

Speaking repeatedly, since water contains the polar molecules, the electromagnetic wave absorber is likely to adsorb moisture in the air if the resin constituting the absorber comprises the polar molecules. The non-polar molecules do not react with the water molecules, and the absorber does not adsorb moisture but remains stable with the passage of time. Because the absorber does not employ the porous structure, its surface area is smaller than that of porous absorbers and air does not permeate into the material. Therefore, the absorber becomes structurally more resistant to adsorb moisture.

The porous structure is more easily inflammable because its surface area is great, but the absorber of the present invention has a smaller contact area with air because it is not porous, and is therefore structurally more anti-flammable. Polyethylene and polypropylene are the thermoplastic resins and their heat resistance is not much high. However, the absorber of the present invention has an improved anti-flammability because it is structurally anti-flammable and because it contains a considerable amount of ferrite powder that is a non-flammable material.

As described above, the ferrite tile absorber that has been used conventionally for the compact anechoic chamber exhibits a large reflection in the frequency band of 1 GHz or above, and the scatter of the electromagnetic waves becomes great in such a frequency band inside the anechoic chamber. In consequence, a stable distribution of the electromagnetic fields cannot be obtained easily at the frequency band of 1 GHz or above and a new electromagnetic absorber capable of coping with the high frequency band becomes necessary. The carbon pyramid absorber as one of the conventional absorbers involves the problems of the effective space and the cost of production.

The upper absorber of the composite absorber according to the present invention has a height of only about 10 cm even when it has the pyramidal shape. Nonetheless, this upper absorber exhibits the excellent absorption performance in the high frequency band without spoiling the characteristics of the ferrite tile, and has the absorption performance of at least 20 dB in the frequency band of up to 10 GHz.

Therefore, an ideal electromagnetic field distribution can be obtained in the high frequency band by fitting the absorber to each face of the anechoic chamber, and the anechoic chamber capable of conducting the EMI/EMS measurement in the high frequency band can be designed. Since the height of the pyramid of the absorber is as low as about 10 cm, this height is substantially equal to the absorber comprising the ferrite tile alone, in practice, from the aspect of the space required for the counter-measures.

In other words, the composite absorber of the present invention makes it possible to conduct the measurement for high frequency band with the chamber size equivalent to the conventional ferrite anechoic chamber, and does not need enlargement of the chamber size. Because the chamber size need not be enlarged, the number and quantity of the necessary materials, including the absorbers, may be reduced, and the cost of production can be kept at a low level. The compact anechoic chamber has often been set up recently in ordinary buildings such as laboratories, and from this aspect, too, the merit of the present absorber is great because it is not required a large chamber size.

This electromagnetic wave absorber is preferably fitted to each and all surfaces of the chamber, but it is also effective to apply only locally to the portion at which the influences of the reflection of the electromagnetic waves are particularly great. As the area for the counter-measurement increases, the amount of use of the absorber, hence, the cost, increases. Therefore, the area of the counter-measurement should be set in accordance with the specification required for the anechoic chamber and its size.

The electromagnetic wave absorber according to the present invention can be additionally fitted (post-installation) to the existing ferrite anechoic chamber. For, the present absorber is small in size and does not have any specific space requirement and does not either impede the absorption characteristics of the ferrite tile in the low frequency band. In other words, the electromagnetic wave absorber of the present invention, when it is applied, can improve the absorption performance only in the high frequency band while keeping the known characteristics of the ferrite tile.

Another problem encountered when using the anechoic chamber is walking of people on the absorber applied to the floor surface. In the case of the measurement for high frequency band, the anechoic chamber is designed into a hexahedral chamber with predetermined free space. In other words, the electromagnetic wave absorber is applied to the floor surface, too. In this instance, an engineer must walk on the absorber on the floor in order to set the antenna, the object for measurement, and so forth.

The conventional carbon pyramid absorber is large in size but has a low strength. Therefore, the design of an alley for passage calls for a careful consideration. Moreover, the materials for the alley must have the lowest reflection of the electromagnetic waves and are therefore limited.

However, the electromagnetic wave absorber according to the present invention is small and yet has a sufficient strength. Therefore, the alley can be readily formed by covering directly the pyramid of the absorber with a limited amount of a material having a low reflection such as styrol foam and using the resin as the base.

As shown in FIGS. 6 and 7, the absorber 4 for the anechoic chamber must have a shape determined by taking the fitting factor into consideration because it is fitted to the ceiling and the wall of the chamber. The basic shape of the upper absorber 3 is the pyramid. When the pyramid is constituted into a hollow structure, fitting becomes more difficult. Therefore, the bottoms of four pyramids are interconnected into a panel structure 5 as shown in FIGS. 6 and 7 so as to reduce the number of man-hour. Shapes 6 and 7 for screw fastening are secured at the center and the side portions of the panel 5 so that the absorber can be mechanically fastened by screws 8.

The panel 5 is fixed fundamentally by the adhesive applied to its bottom surface. However, the screws fastening is used as a preventive measure against a peeling of the adhesive, etc. The screw 8 is fixed to the shield panel 10 through a φ10 through-hole 9 formed at the center of the ferrite tile 2.

Here, because fixing is made through the through-hole 9 of the ferrite tile 2, the number of the screws 8 that can be used is limited. Furthermore, the number of the metallic screws is preferably as small as possible because they reflect the electromagnetic waves. For these reasons, the screw hole shape of the panel side portions is arranged in such a fashion that when the two panels are butted against each other, one screw fitting portion is defined and one screw 8 can fix two panel side portions. In this way, the number of the screws 8 used is reduced (see FIG. 8).

The screw hole shape 7 defined in the panel 5 of the absorber 4 is a semicircular hole, as shown in FIG. 9. When the adjacent panels 5 are connected, the semicircular holes together define a perfect circle for fitting the screw 8.

The panel 5 has rectangular shape having a size equal to the sum of four rectangular ferrite tiles 2. The panels 5 are juxtaposed while their side edges are positioned at the center of the ferrite tiles. As result, the semicircular hole 7 is positioned at the center of the side edge of each panel 5.

Since the adhesive and screw fastening are used in combination as described above, fixing can be made more reliably and easiness of the fitting can be improved. When the absorber panel is produced, a production method must have high freedom of shapes. When the thermoplastic resin is used for the constituent resin, integral molding can be made by injection molding or extrusion molding. Therefore, a process step for shaping the panel is not necessary, and the panel can be obtained when the absorber is molded, and can be produced economically.

BRIEF DESCRIPTION OF THE DRAWINGS

FIG. 10 is a front view showing the appearance of an anechoic chamber; and

FIG. 11 is an explanatory view useful for explaining the outline of measurement of uniformity of electromagnetic field strength.

DESCRIPTION OF THE PREFERRED EMBODIMENTS

[Ferrite Tile]

Figure 1:
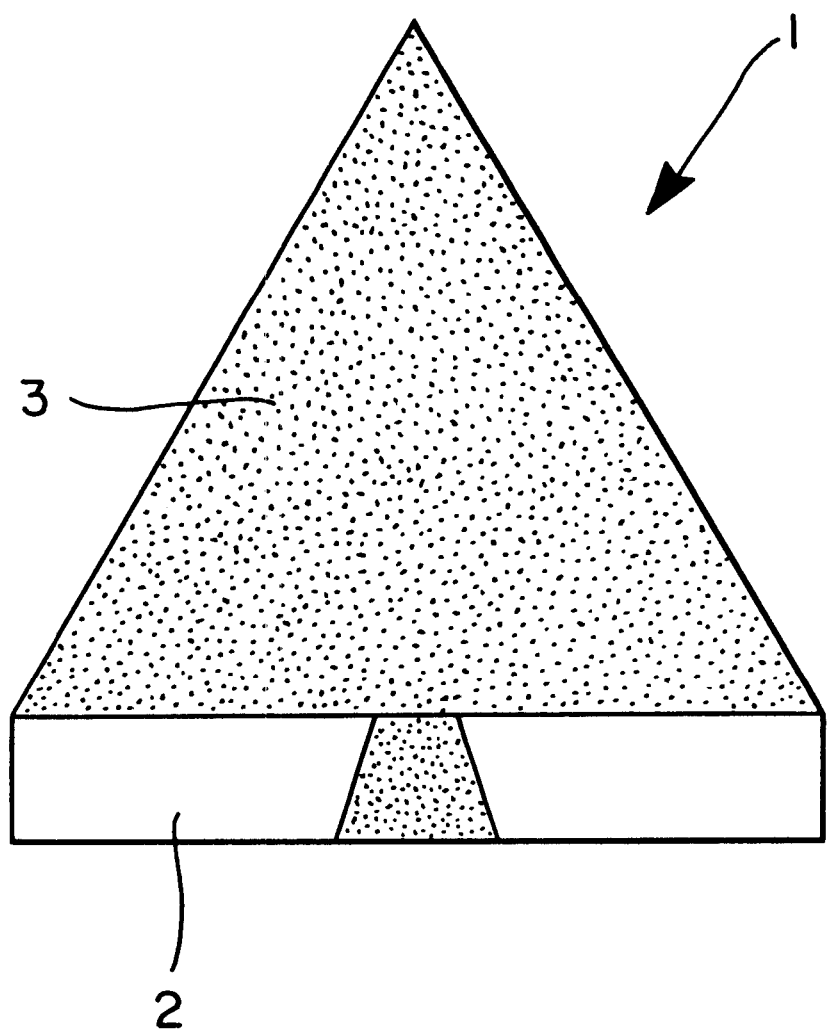
FIG. 1 is a front view of a composite electromagnetic wave absorber according to one embodiment of the present invention.

Since the electromagnetic wave absorber according to the present invention is a composite absorber comprising ferrite tiles and upper absorbers, the ferrite tile is also one of the very important elements in the present invention. When the assembly of the ferrite tile/upper absorber is considered, the electromagnetic waves penetrate only the upper absorber. Therefore, all kinds of ferrite tiles can be employed, in principle. Generally, however, $Fe_2O_3/NiO/ZnO/CuO$ type ferrite is used in most cases because the ferrite tile is required to exhibit high absorption performance in the frequency range of 30 MHz to 1 GHz. As to the size, the greater the size, the better, because insulation of a magnetic circuit does occur at the junction portions. Practically, however, the tile having a size of 10 cm×10 cm or 20 cm×20 cm is used. Since the resonance frequency is determined by the thickness of an air layer (air gap) existing at the back of the ferrite tile, the electrical constant and thickness of the ferrite tile, the thickness of the ferrite tile should be selected so that the absorption attains the maximum at the frequency intended by the designer of the anechoic chamber.

[Raw Materials of Upper Absorber and Mixing Ratio]

The upper absorber in the present invention is prepared by dispersing ferrite powder into a matrix comprising a non-polar resin, as described in the foregoing paragraph of "Summary of the Invention". Here, the following equation can be established between permeability $\mu r(t)$ and permittivity $\epsilon r(t)$ of the upper absorber as a composite body:

$$\mu r(t)=\mu r(a)x+\mu r(b)(1-x) \quad (3)$$

$$\epsilon r(t)=\epsilon r(a)x+\epsilon r(b)(1-x) \quad (4)$$

Here, $\mu r(a)$, $\mu r(b)$, $\epsilon r(a)$ and $\epsilon r(b)$ represent the permeability and the permittivity of ferrite power (a) and the resin (b) in the composite body, respectively. Symbol x represents the volume fraction of ferrite powder. Since the resin is a non-magnetic material, $\mu r(b)=1$. When the values $\mu r(a)$ and $\epsilon r(a)$ of ferrite powder dispersed in the resin are determined by experiments, they are found as:

$$\mu r(a)=8.5, \epsilon r(a)=6.4.$$

To satisfy the transparency in a low frequency band below 1 GHz, equation (1) and (2) must be satisfied. Therefore, by setting $\mu r(t)=\epsilon r(t)$, the following equation is established:

$$8.5x+(1-x)=6.4x+\epsilon r(b)(1-x) \quad (5)$$

From equation (5), the following equation can be obtained:

$$\epsilon r(b)=(1+1.1x)/(1-x) \quad (6)$$

When ferrite powder is dispersed into the resin, the maximum content of ferrite powder is believed to be at most 65 vol % for shaping. Therefore, the range of x in equation (6) is $$0<x<0.65 \quad (7)$$

When this value x is substituted for equation (6), $$1<\epsilon r(b)<4.9$$

Therefore, the permittivity $\epsilon r(b)$ of the resin that satisfies the transparency on the low frequency side must be 4.9 or below.

From the result of analysis described above, the resin that can be used in the present invention is a resin which has a permittivity of not greater than 4.9. From the values of the permittivity at $10^6$ Hz that are shown in Plastic Performance Table in "Plastics Technical Handbook" by Yujiro Sakurai (published by Kogyo Chosa-kai), pp. 353–358, polyethylene, polypropylene, fluorocarbon resins and polytetrafluoroethylene can be selected as the ideal resins as the non-polar resins, but it is also possible to use an aryl resin, an epoxy resin, a vinyl chloride resin, a vinyl acetate resin, polystyrene, an acrylic resin, a polyamide resin, a polyacetal resin, a polycarbonate resin and an acetyl cellulose resin, each having the $\epsilon r$ value of not greater than 4.9.

The term "non-polar resin" herein used means those resins which comprise molecules not having an electric dipole, molecules of which the dipolar moment is offset due to symmetry of the molecules, or molecules having a polar coupling of a low polarity. The resins listed above are typical examples of the resins that have been put into practical application to this date. Therefore, novel resins that will be developed in future are also embraced within the scope of the present invention so long as they are the non-polar resins having a low permittivity. Furthermore, because these resins are the principal component, additives for improving the anti-flammability, the strength, and so forth, may be added to these resins.

As to the matching condition $\mu r=\epsilon r$ at the low frequency described above, it is extremely difficult to establish this matching over a broad frequency band. Therefore, the present invention expresses the difference of their numerical values by the ratio $\mu r/\epsilon r$ and sets the allowable range as follows:

$$0.25 \leq \mu r/\epsilon r \leq 2.5$$

If $\mu r/\epsilon r<0.25$ or $\mu r/\epsilon r>2.5$, reflection of the surface of the material becomes so great that absorption characteristics of the ferrite tile are impeded.

Ferrite powder must contain the ferrite component that exhibits excellent absorption performance in a high frequency band of 1 GHz or more under the state where it is dispersed in the resin. This ferrite component is the same of the ferrite tile, that is, the $Fe_2O_3/NiO/ZnO$ type, the $Fe_2O_3/NiO/ZnO/CuO$ type or the $Fe_2O_3/MnO/ZnO$ type.

In connection with the mixing ratio of ferrite powder to the resin, the upper limit of the mixing volume fraction of ferrite powder is limited to 65 vol % from the limitations imposed on production method and from the condition that the conditions (1) and (2) must be satisfied on the low frequency side of 1 GHz or less. On the other hand, the lower limit of the mixing volume fraction of ferrite power should be decided in the amount of ferrite powder that satisfies the required absorption performance on the high frequency side of 1 GHz or more. The lower limit of the ferrite mixing ratio is set to 10 vol % in the sense that absorption performance of 10 dB can be acquired on the high frequency side of 1 GHz or more. However, in order for the electromagnetic wave absorber of the present invention to have sufficient absorption performance when applied practically to the anechoic chamber, an absorption performance of 20 dB is believed necessary. Therefore, the lower limit value of the mixing content of ferrite powder to secure this absorption performance of 20 dB is set to 30 vol % as described later. Thus, the mixing ratio of ferrite powder in the present invention is from 10 to 65 vol %, and more preferably from 30 to 65 vol %.

[Shape of Upper Absorber]

The shape of the upper absorber may be a flat plate, pyramidal or wedge-shaped. The flat plate absorber can be produced at a low cost because it can be shaped by press molding, but its absorption frequency band becomes narrower because the resonance frequency on the higher frequency side than 1 GHz becomes smaller.

On the other hand, the wedge-shaped absorber or the pyramidal absorber provides a density gradient of the material inside the space by means of its shape, and broadens the absorption frequency band by the effect similar to that of a multi-layered absorber. This shape-wise density gradient may be generated by combining a hollow structure with a sheet structure. The wedge-shaped absorber and the pyramidal absorber have the broader absorption frequency band and higher absorption characteristics than those of the sheet-like absorber, but the shapes are more complicated and the costs of production become higher. Therefore, the appropriate shape should be selected in accordance with required performance of the anechoic chamber and the required cost.

[Bonding Method of Ferrite Tile and Upper Absorber]

The following two can be employed as the bonding methods of the ferrite tile and the upper absorber in the present invention. One is the method in which the upper absorber is molded onto the ferrite tile to form a unit. More concretely, this method contains that the ferrite tiles having small inverted taper holes are put into a mold, injection molding, extrusion molding, cast molding, or the like is conducted under this state, and then the ferrite tiles and the upper absorbers under the bonded state are released from the mold. This method can simultaneously accomplish molding and bonding and can restrict to the cost of production to a low level. In addition, because mechanical fitting is taken into consideration, fixing can be made reliably. The other is the method in which adhesive is applied to the bottom surface of the upper absorber. This method is effective for fitting in a spot or for adding the absorber to the existing ferrite anechoic chamber. FIG. 1 shows an example of the ferrite tile and the upper absorber so bonded.

[Fitting Method of Composite Absorber]

When the composite absorbers formed by bonding the ferrite tiles and the upper absorbers are fitted inside the anechoic chamber, the gaps between metallic reflecting plates disposed on the outer wall of the chamber and the composite absorbers must be optimized. The gap between the back of the ferrite tile and the metallic reflecting plate affects the resonance frequency of the ferrite tile absorber depending on the change of the phase, that is, the absorption frequency band. Therefore, the absorption characteristics of the composite absorber can be rendered further effective by optimizing this gap.

The composite electromagnetic wave absorber 1 comprises the ferrite tile 2 and the pyramidal electromagnetic wave absorber 3 on the ferrite tile 2, as shown in FIG. 1.

[Ferrite Tile 2]

(1) Material Composition:

TABLE 1

| $Fe_2O_3$ | NiO | ZnO | CuO |
|---|---|---|---|
| 49.3 mol % | 13.8 mol % | 32.9 mol % | 3.9 mol % |

(2) Shape:

A flat plate of $100 \times 100 \times 6.3$ mm$^3$.

PRODUCTION METHOD

Granulated powder having the composition shown in Table 1 was press-molded at 1 ton/cm$^2$ and was then fired at 1,200° C. for one hour. Thereafter, grinding was conducted on the hexahedral faces.

[Upper Absorber 3]

(1) Ferrite Powder Material Composition:

Table 2 shows the material composition of ferrite powder used for the upper absorber.

TABLE 2

| $Fe_2O_3$ | NiO | ZnO |
|---|---|---|
| 48.8 mol % | 30.8 mol % | 20.4 mol % |

(2) Kinds of Resin:

Commercially available polypropylene was used for Example.

(3) Mixing Ratio:

Ferrite powder and polypropylene (hereinafter called "PP") were blended in the following ten mixing ratios. Table 3 shows them in terms of a volume fraction.

TABLE 3

| Ferrite Powder | 10 | 15 | 20 | 25 | 27.5 | 30 | 32.5 | 35 | 37.5 | 40 |
|---|---|---|---|---|---|---|---|---|---|---|
| PP | 90 | 85 | 80 | 75 | 72.5 | 70 | 67.5 | 65 | 62.5 | 60 |

(4) Shape:

A hollow pyramidal shape having a bottom side of $100 \times 100$ mm$^2$, a height of 100 mm and a hollow structure of a thickness of 20 mm.

(5) Production Method:

Each mixture of ferrite powder/PP powder having a mixing ratio shown in Table 3 was kneaded by a pressure kneader, was pelletized by a pelletizer, and was then injection-molded to the pyramidal shape described above.

(6) Bonding Method of Ferrite Tile, and Upper Absorber:

Two kinds of commercially available adhesives (PP-5 (primer)+PM-100, products of Cemedine Co.) were used.

(7) Absorption Measurement of Composite Absorber:

The absorption characteristics of the composite absorber were measured by a co-axial air line method using a network analyzer (up to 1 GHz) in combination with a time domain method (1 GHz or more).

Figure 2:
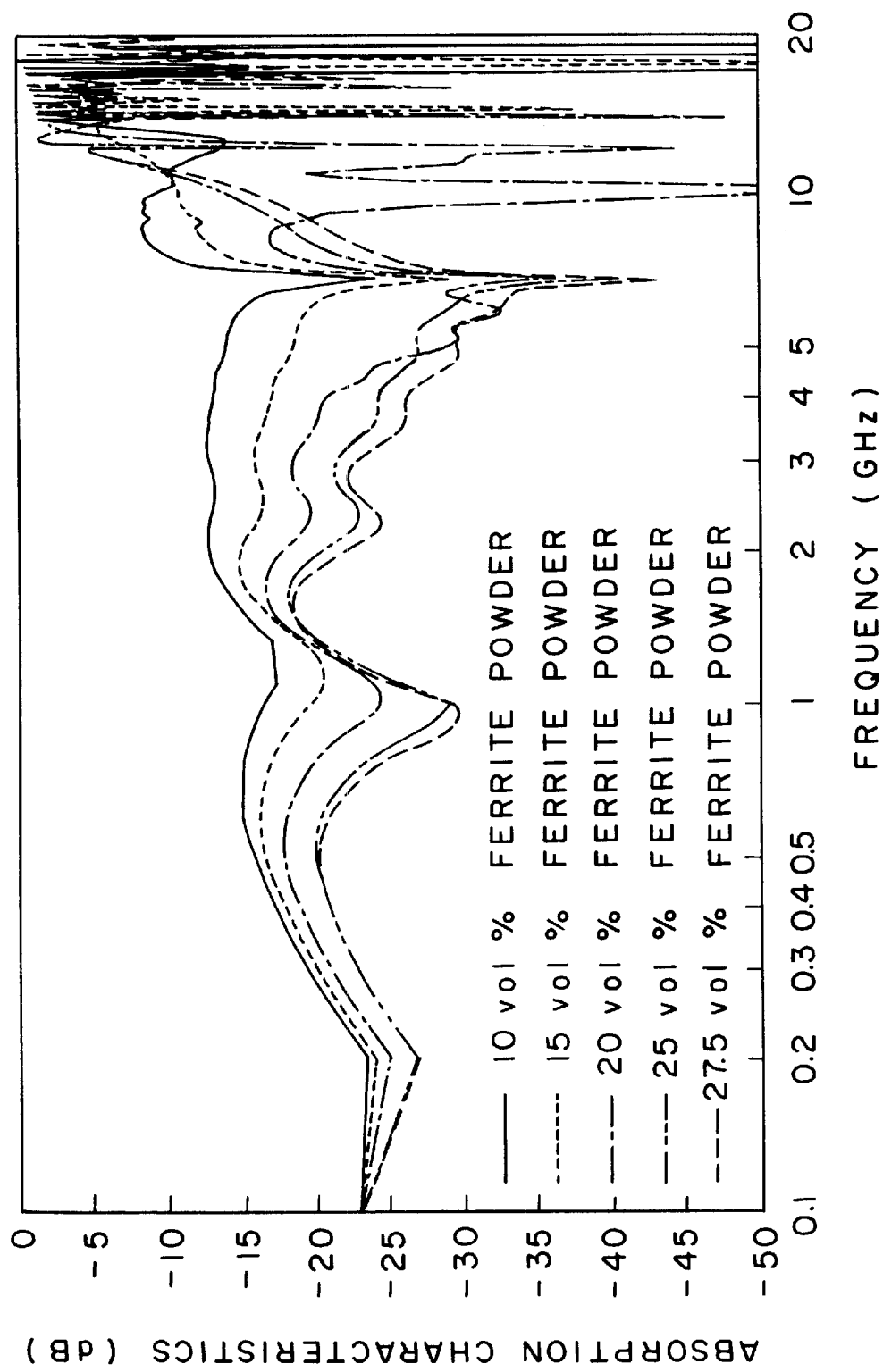
FIG. 2 is a graph showing the relation between frequency and electromagnetic wave absorption characteristics in connection with the amount of ferrite powder.
Figure 3:
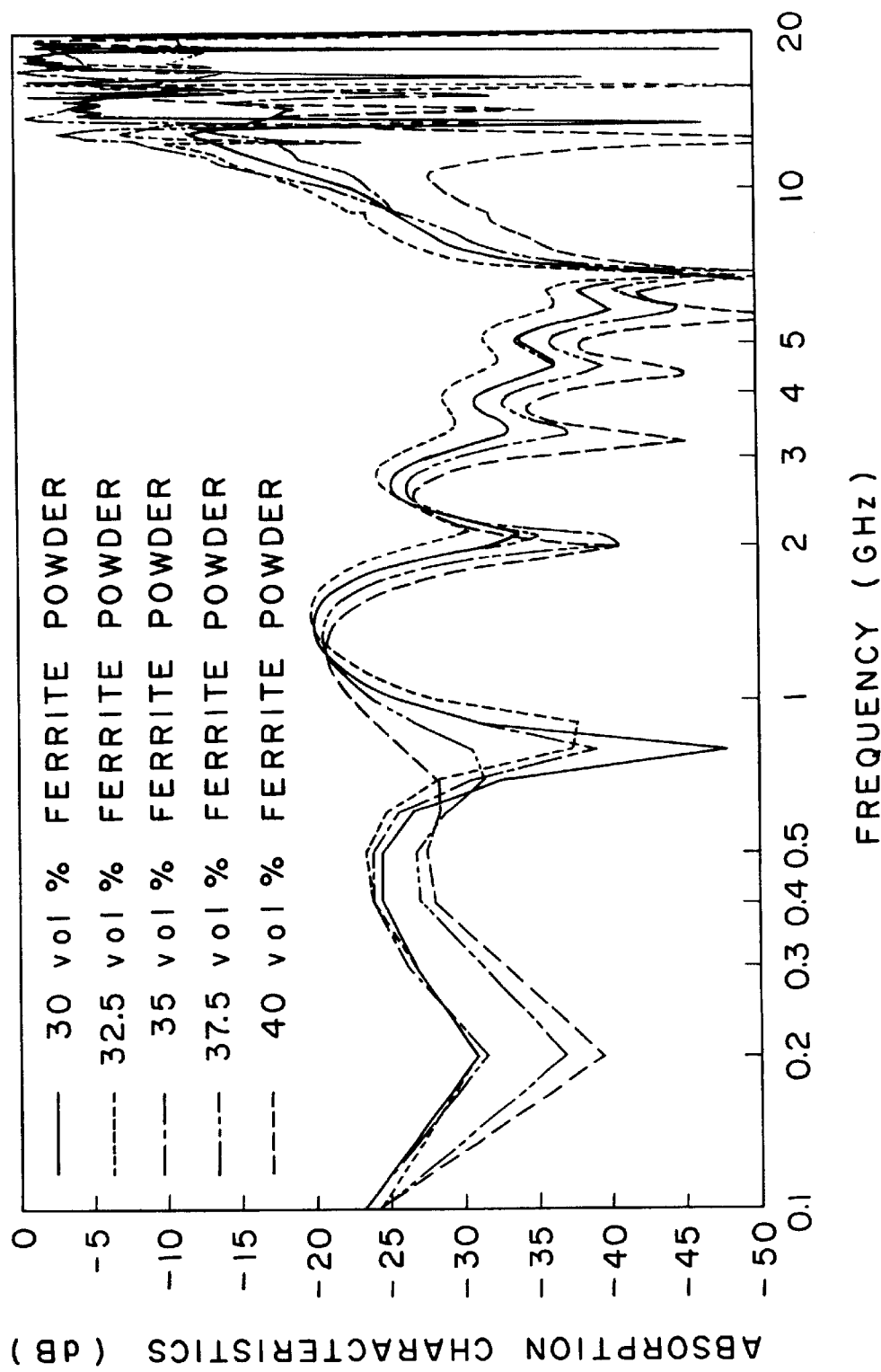
FIG. 3 is a graph showing the relation between frequency and electromagnetic wave absorption characteristics in connection with the amount of ferrite powder.

The results of the measurement of the absorption characteristics of the composite absorber are shown in FIGS. 2 and 3. The absorption performance of at least 10 dB was observed up to 7 GHz when the ferrite powder mixing ratio of the upper absorber was 10 vol % as shown in FIG. 2. It could be seen clearly from FIG. 3, too, that the absorption performance of at least 20 dB, that was the absorption characteristic value usable for the absorber of the anechoic chamber, was satisfied over a broad frequency band of 100 MHz to 10 GHz when the ferrite powder mixing ratio was at least 30 vol %.

Figure 4:
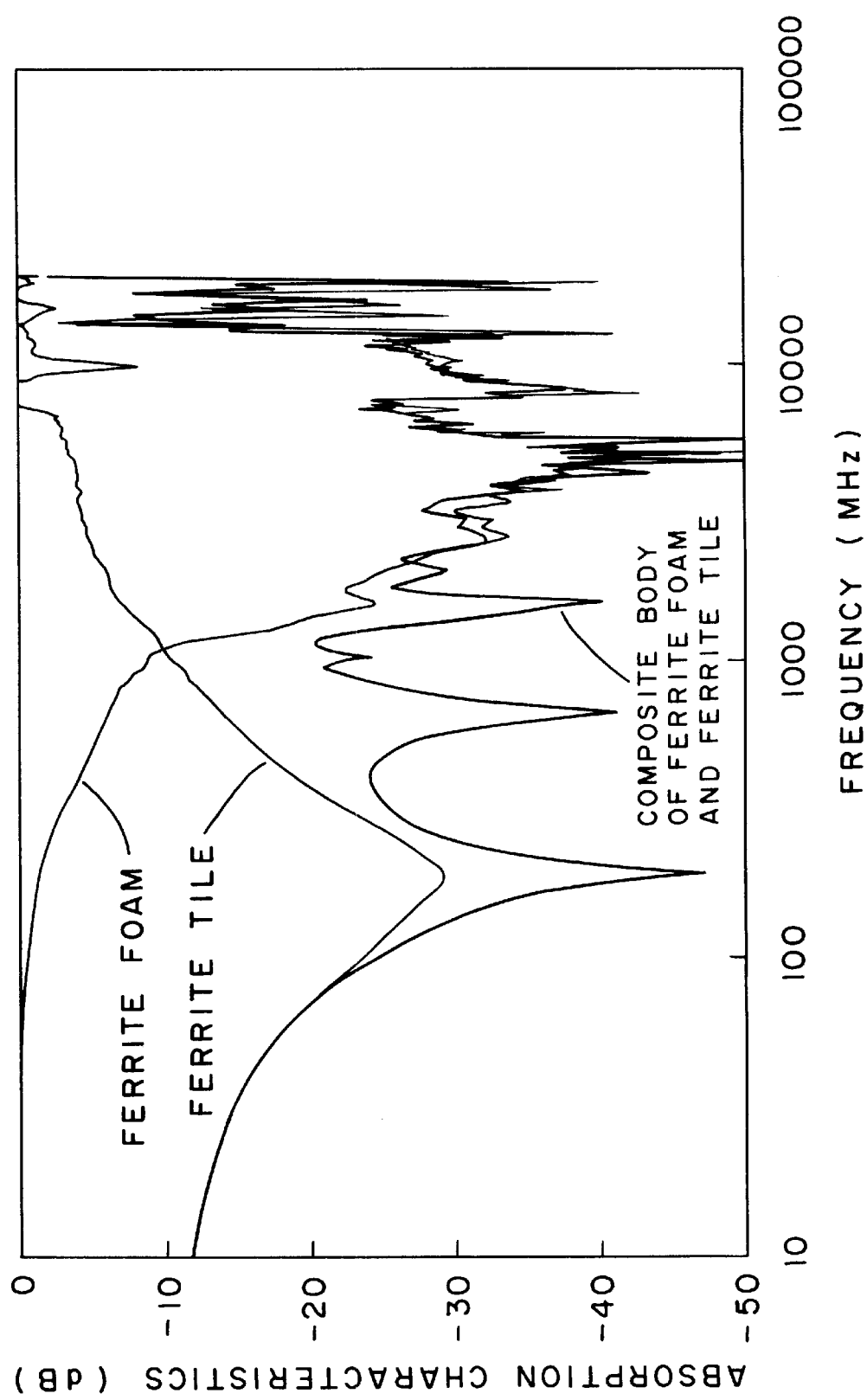
FIG. 4 is a graph showing the relation between frequency and electromagnetic wave absorption characteristics in an electromagnetic wave absorber according to the prior art.

For comparison, FIG. 4 shows the absorption characteristics of ferrite tile/porous ferrite (fired type porous ferrite) disclosed in Japanese Patent Laid-Open Publication Nos. 302991/1995 and 130388/1996. The results of the measurement of the absorption characteristics of the "ferrite foam+ ferrite tile" shown in this graph were substantially equal to the case where the mixing ratio of ferrite powder in the upper absorber of the composite absorber in the present invention was at least 30 vol %.

Figure 5:
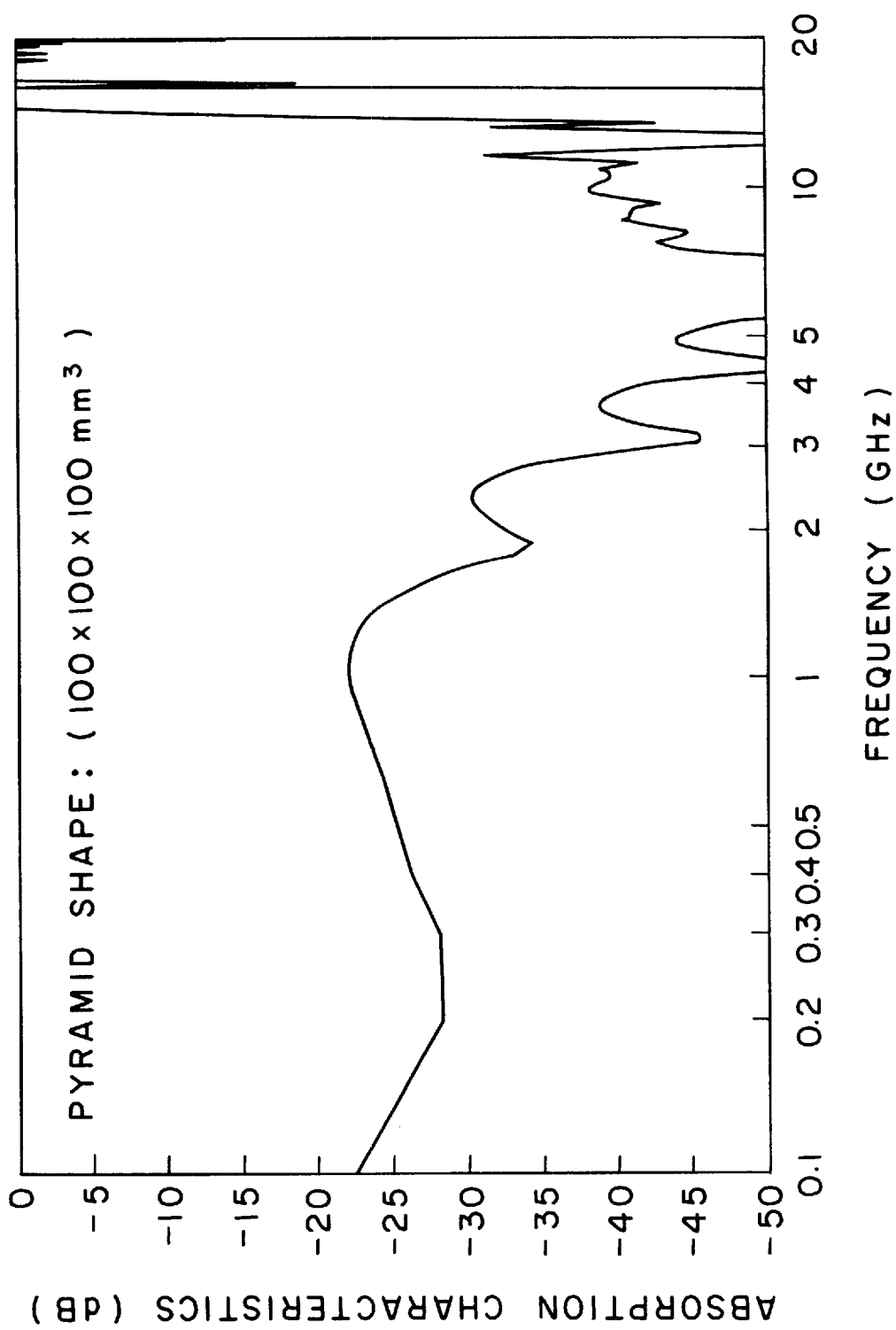
FIG. 5 is a graph showing the relation between frequency and electromagnetic wave absorption characteristics in an electromagnetic wave absorber according to the prior art.

For reference, FIG. 5 shows also the absorption characteristics of ferrite tile/porous ferrite (phenol resin foam type porous absorber) described in Japanese Patent Application No. 183640/1998. The absorption characteristics shown in FIG. 5 were also substantially equivalent to those of the composite absorber of the present invention (with the proviso that the ferrite powder mixing ratio of the upper absorber was at least 30 vol %).

As described above, the absorption characteristics of the composite absorber according to the present invention were substantially equal to those of ferrite tile/porous ferrite invention that was applied in the past. Therefore, the object of achieving the economical absorber without deteriorating the excellent absorption characteristics obtained by ferrite tile/porous ferrite can be said as being accomplished without using the porous material.

[Electromagnetic Wave Absorber Panel and Fitting Method Thereof]

Figure 6:
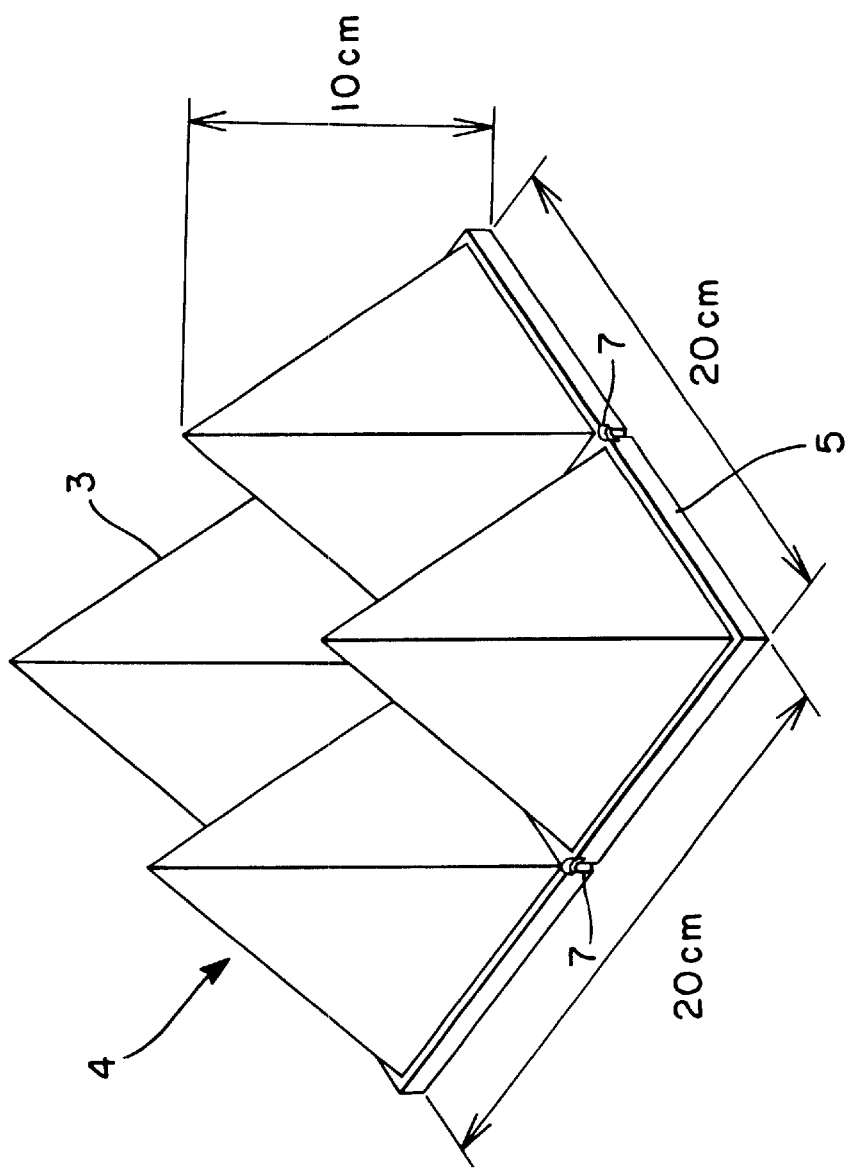
FIG. 6 is a perspective view of an electromagnetic wave absorber panel.
Figure 7:
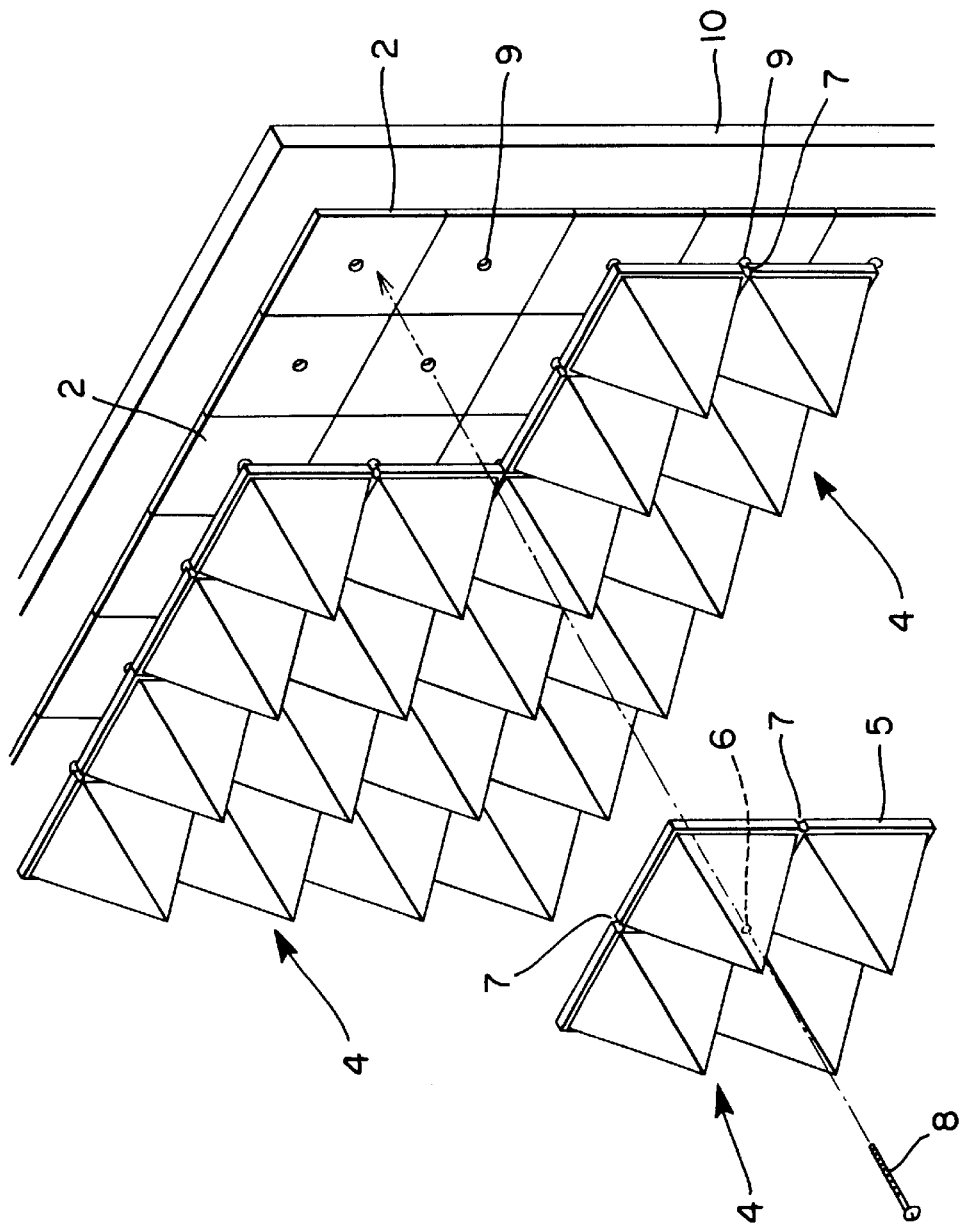
FIG. 7 is a perspective view showing the fitting of an electromagnetic wave absorber panel.
Figure 8:
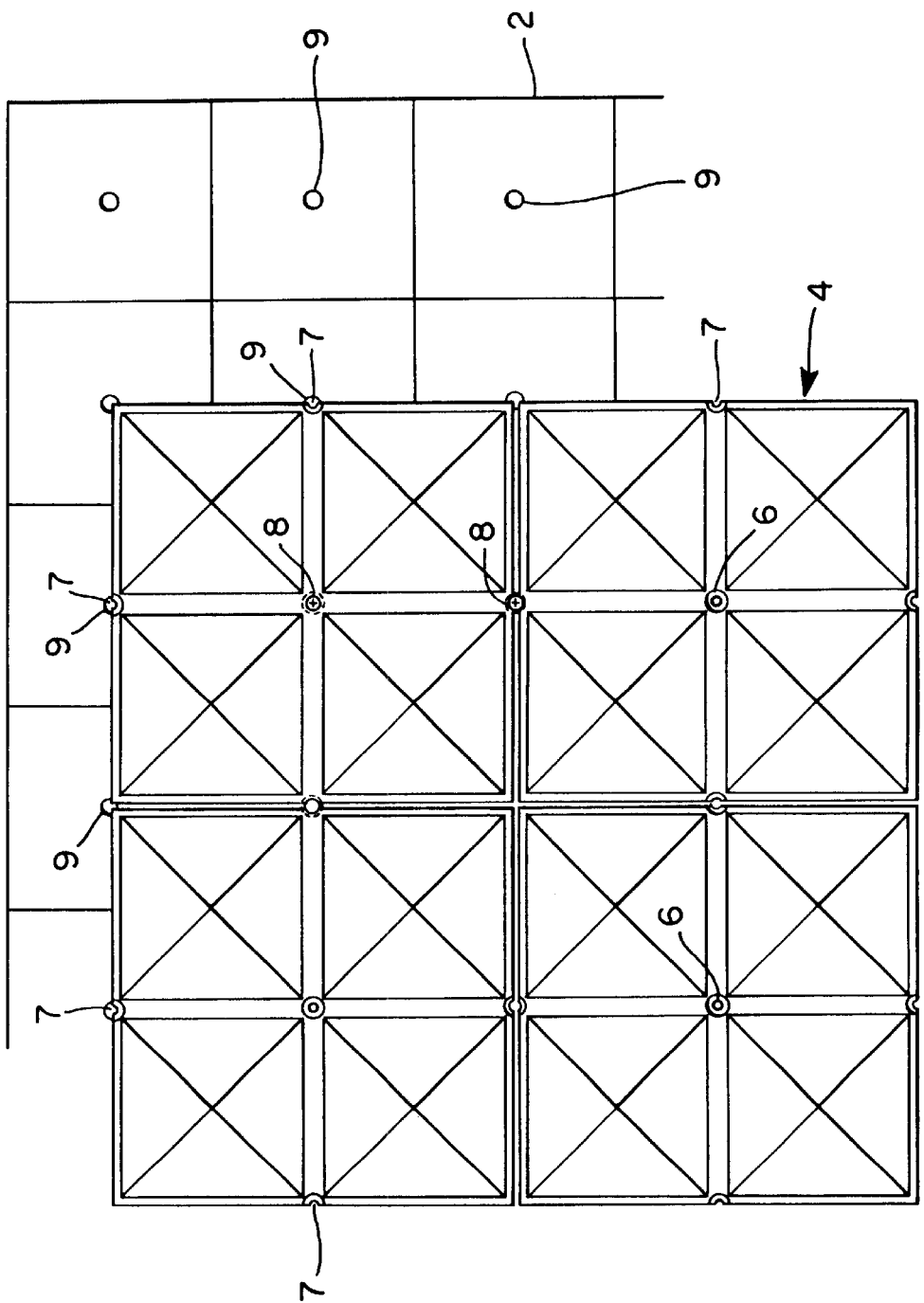
FIG. 8 is a plane view showing the fitting of the electromagnetic wave absorption panel.
Figure 9:
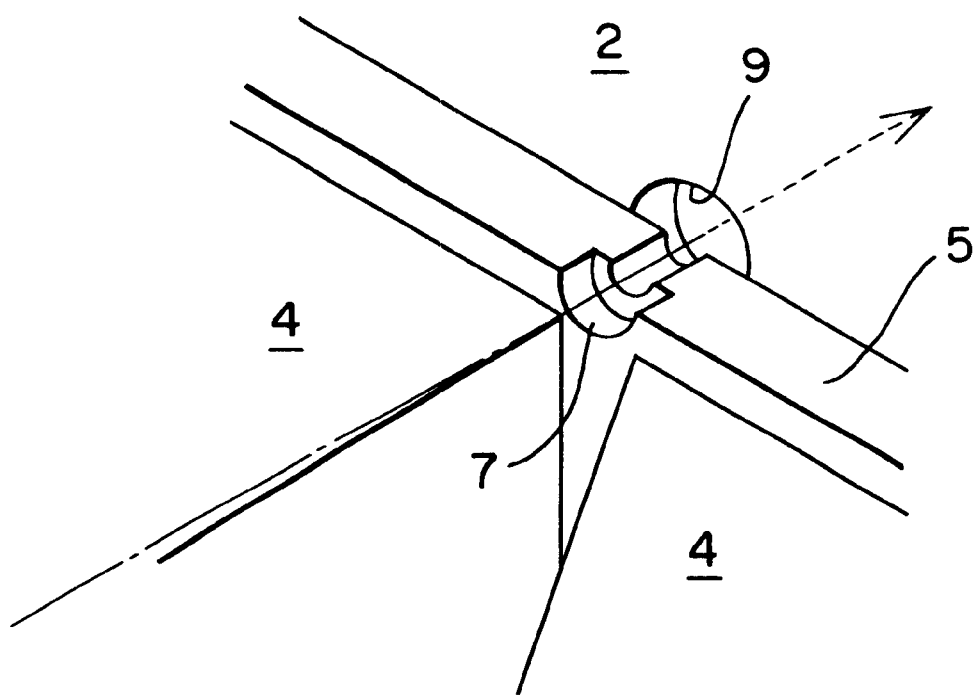
FIG. 9 is an enlarged view of a screw fitting shape.

Panels of the absorber 4 having the shape shown in FIG. 6 were extrusion-molded using a polypropylene resin.

The absorber panels so molded were fitted by using the screws 8 and the adhesives within the range of 3 m of the center portion of the surface of each of the ceiling, the wall and the floor in an anechoic chamber having a width of 4 m, a length of 7 m and a height of 3.4 m and being constituted by the ferrite tiles 2.

FIG. 10 shows the appearance of the anechoic chamber. The measurement test of the uniformity of electromagnetic field strength was conducted inside this anechoic chamber. The intensity of the electric field to the horizontal and vertical polarized waves emitted from an antenna was measured by a field probe at 16 points (with a 50 cm spacing in both longitudinal and transverse directions) on a virtual vertical plane having a size of 1.5 m in length and width at a height of 80 cm over a turn table. In this instance, 75% or more of all the measuring points were required to fall within the range of 0 to +6 dB for both polarized waves of a corresponding frequency.

When the uniformity of electromagnetic field strength was measured for the range of 26 MHz to 6 GHz, it was confirmed that 75% or more of the measuring points fell within the range of 0 to +6 dB and sufficient high frequency characteristics could be obtained. Since this absorber panels were additionally fitted to the existing anechoic chamber, the present invention made it possible to take counter-measure with the existing chamber size without requiring an additional space.

As many apparently widely different embodiments of the present invention can be made without departing from the spirit and scope thereof, it is to be understood that the invention is not limited to the specific embodiments thereof except as defined in the appended claims.

What is claimed is:

1. A composite electromagnetic wave absorber comprising an assembly fabricated by bonding ferrite tiles and upper absorbers having a shape of a flat plate, a wedge shape or a pyramidal shape, wherein said upper absorber is prepared by dispersing ferrite powder in a general-purpose resin having a permittivity of not greater than 4.9 at a frequency of at least 1 MHz, wherein said ferrite tile comprises $Fe_2O_3$, NiO, ZnO and CuO as the principal components, said ferrite powder in said upper absorber comprises $Fe_2O_3$, NiO and ZnO as the principal components, and said general-purpose resin comprises at least one non-polar resin or resin approximate to said non-polar resin selected from the group consisting of polyethylene, polypropylene, a fluorocarbon resin, polytetrafluoroethylene, an allyl resin, an epoxy resin, a vinyl chloride resin, a vinyl acetate resin, a styrol resin, an acrylic resin, a polyamide resin, a polyacetal resin, a polycarbonate resin and an acetyl cellulose resin.

2. A composite electromagnetic wave absorber according to claim 1, wherein said upper absorber contains, in terms of a volume fraction, 10 to 65 vol % of said ferrite powder and the balance comprising said general-purpose resin, and a ratio $\mu r/\epsilon r$ of a permeability $\mu r$ to a permittivity $\epsilon r$ in a frequency range of not higher than 1 GHz satisfies the relation:

$$0.25 \leq \mu r/\epsilon r \leq 2.5.$$

3. A composite electromagnetic wave absorber according to claim 2, which satisfies the relation:

$$\mu r/\epsilon r = 1.$$

4. A composite electromagnetic wave absorber according to claim 1, wherein said upper absorber contains, in terms of a volume fraction, 30 to 65 vol % of the ferrite powder and the balance comprising at least one kind of resins selected from polyethylene, polypropylene, a fluorocarbon resin and polytetrafluoroethylene; a ratio $\mu r/\epsilon r$ of a specific permeability $\mu r$ to a specific dielectric constant $\epsilon r$ within a frequency range of not higher than 1 GHz satisfies the relation:

$$0.25 \leq \mu r/\epsilon r \leq 2.5;$$

and absorption performance within a frequency range of 100 MHz to 10 GHz is at least 20 dB.

5. A composite electromagnetic wave absorber according to claim 4, which satisfies the relation:

$$\mu r/\epsilon r = 1.$$

6. An electromagnetic wave absorber panel having a pyramidal shape, comprising a resin and ferrite as principal components thereof, and being so arranged as to match material-wise with a spatial impedance, wherein said electromagnetic wave absorber panel has an integral panel shape of four interconnected face portions of a pyramid, and portions for screw fastening are shaped at the center and at four side edge portions of said panel.

7. A fitting method of an electromagnetic wave absorber panel, comprising:

providing an electromagnetic wave absorber panel comprising a resin and ferrite as principal components thereof, and being so arranged as to match material-wise with a spatial impedance, wherein said electromagnetic wave absorber panel has an integroal panel shape of four interconnected face portions of a pyramid, and a portion for screw fastening is formed at the center and at each of four side edge portions of said panel;

applying an adhesive to the bottom face of said panel;

fastening by a screw said electromagnetic wave absorber panel onto a shield panel comprising a plurality of ferrite tiles through a screw hole formed at the center of said electromagnetic wave absorber panel and a through-hole formed at the center of a ferrite tile of said plurality of ferrite tiles; and fixing the side portions of said electromagnetic wave absorber panel using in common one screw through a screw hole formed from said portion for screw fastening formed at a side edge portion of said panel when said electromagnetic wave absorber panels are butted to one another, and through a through-hole at the center of another ferrite tile of said plurality of ferrite tiles.

8. A compact anechoic chamber for EMC evaluation, comprising:

a shield chamber having the outermost portion thereof constituted by a metallic plate or shield panels for constituting said metallic plate;

ferrite tiles fitted to the entire surface of said metallic plate or said shield panels; and an electromagnetic wave absorber fitted to the entire surface of said ferrite tiles or to a part of the center of each surface, said electromagnetic wave absorber comprising an assembly fabricated by bonding ferrite tiles and upper absorbers having a shape of a flat plate, a wedge shape or a pyramidal shape, wherein said upper absorber is prepared by dispersing 30 to 65 vol % of ferrite powder in a general-purpose resin having a permittivity of not greater than 4.9 at a frequency of at least 1 MHz and selected from the group consisting of polyethylene, polypropylene, a fluorocarbon resin and polytetrafluoroethylene, wherein said ferrite tile comprises $Fe_2O_3$, NiO, ZnO and CuO as the principal components and said ferrite powder in said upperabsorber comprises $Fe_2O_3$, NiO and ZnO as the principal components, and wherein $\mu$ratio 82 r/$\epsilon$r of a specific permeability $\mu r$ to a specific dielectric constant $\epsilon r$ within a frequency range of not higher than 1 GHz satisfies the relation:

$$0.25 \leq \mu r/\epsilon r \leq 2.5;$$

and an absorbtion performance within a frequency range of 100 MHz to 10 GHz is at least 20 dB.

9. A composite electromagnetic wave absorber comprising an assembly fabricated by bonding ferrite tiles and upper absorbers having a wedge shape or a pyramidal shape, wherein said upper absorber is prepared by dispersing ferrite powder in a general-purpose resin having a permittivity of not greater than 4.9 at a frequency of at least 1 MHz.

* * * * *